United States Patent
Kim et al.

(10) Patent No.: US 8,916,000 B2
(45) Date of Patent: Dec. 23, 2014

(54) SYSTEM AND METHOD FOR PRODUCING CARBON NANOTUBES

(75) Inventors: Sung-Soo Kim, Chungchengnam-do (KR); Ho-Soo Hwang, Gyeonggi-do (KR); Hyung-Seok Kim, Gyeonggi-do (KR); Suk-Won Jang, Gyeonggi-do (KR); Suk-Min Choi, Gyeonggi-do (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 857 days.

(21) Appl. No.: 12/095,273

(22) PCT Filed: Nov. 29, 2006

(86) PCT No.: PCT/KR2006/005099
§ 371 (c)(1),
(2), (4) Date: Jul. 23, 2008

(87) PCT Pub. No.: WO2007/064148
PCT Pub. Date: Jun. 7, 2007

(65) Prior Publication Data
US 2008/0305031 A1 Dec. 11, 2008

(30) Foreign Application Priority Data

Nov. 29, 2005 (KR) .................. 10-2005-0115002
Jan. 5, 2006 (KR) .................. 10-2006-0001242

(51) Int. Cl.
*C23C 16/54* (2006.01)
(Continued)

(52) U.S. Cl.
CPC ......... *C01B 31/0233* (2013.01); *C23C 16/0272* (2013.01); *C23C 16/56* (2013.01); *C23C 16/54* (2013.01); *B82Y 30/00* (2013.01); *B82Y 40/00* (2013.01)

USPC ............ 118/719; 118/100; 118/104; 118/120

(58) Field of Classification Search
None
See application file for complete search history.

(56) References Cited

U.S. PATENT DOCUMENTS 5,227,038 A * 7/1993 Smalley et al. ............... 204/173
5,577,621 A * 11/1996 Yi ............................... 211/41.18

(Continued)

FOREIGN PATENT DOCUMENTS

JP 2001-262343 A 9/2001
JP 2004-299926 A 10/2004

(Continued)

OTHER PUBLICATIONS

International Search Report dated Feb. 22, 2007.

*Primary Examiner* — Karla Moore
(74) *Attorney, Agent, or Firm* — Sterne, Kessler, Goldstein & Fox P.L.L.C.

(57) ABSTRACT

A system for producing carbon nanotubes includes a reaction chamber in which a process is performed for producing a carbon nanotube on a synthetic substrate; a station part disposed at one side of the reaction chamber and provided with a first transporter for loading/unloading the synthetic substrate to/from the reaction chamber; a first transporter installed inside the station part for loading/unloading synthetic substrates to/from the reaction chamber; a substrate accommodating part in which a substrate to be loaded to the reaction chamber is accommodated or a synthetic substrate unloaded from the reaction chamber waits; a retrieve part for drawing out a synthetic substrate from the substrate accommodating part to retrieve a carbon nanotube produced on the synthetic substrate; a catalyst coating unit configured for coating a synthetic substrate with a catalyst before the synthetic substrate is accommodated in the substrate accommodating part of the station part; and a second transporter for transporting a synthetic substrate between the retrieve part and the substrate accommodating part and between the catalyst coating unit and the substrate accommodating part.

26 Claims, 13 Drawing Sheets

(51) Int. Cl.
  *C01B 31/02* (2006.01)
  *B82Y 30/00* (2011.01)
  *B82Y 40/00* (2011.01)
  *C23C 16/02* (2006.01)
  *C23C 16/56* (2006.01)

(56) References Cited

U.S. PATENT DOCUMENTS

| | | | |
|---|---|---|---|
| 5,882,413 A * | 3/1999 | Beaulieu et al. | 118/719 |
| 6,544,463 B1 | 4/2003 | Luzzi et al. | |
| 6,589,682 B1 * | 7/2003 | Fleckner et al. | 429/34 |
| 6,866,801 B1 | 3/2005 | Mau et al. | |
| 6,887,453 B2 | 5/2005 | Brorson et al. | |
| 8,142,569 B2 * | 3/2012 | Kalynushkin et al. | 118/718 |
| 2002/0023583 A1 * | 2/2002 | Kumokita et al. | 118/108 |
| 2004/0149209 A1 | 8/2004 | Dai et al. | |
| 2006/0060301 A1 * | 3/2006 | Lazovsky et al. | 156/345.26 |
| 2007/0092431 A1 * | 4/2007 | Resasco et al. | 423/447.3 |
| 2007/0231246 A1 * | 10/2007 | Hwang et al. | 423/460 |
| 2010/0278713 A1 * | 11/2010 | Hwang et al. | 423/447.1 |
| 2010/0284897 A1 * | 11/2010 | Kim et al. | 423/447.3 |

FOREIGN PATENT DOCUMENTS

| | | | |
|---|---|---|---|
| JP | 2005053709 | | 3/2005 |
| JP | 2005053709 A | * | 3/2005 |
| JP | 2005067916 | | 3/2005 |
| JP | 2005-097014 A | | 4/2005 |
| JP | 2006-027948 A | | 2/2006 |
| JP | 2006-225199 A | | 8/2006 |
| JP | 2007-045637 A | | 2/2007 |

* cited by examiner

SYSTEM AND METHOD FOR PRODUCING CARBON NANOTUBES

TECHNICAL FIELD

The present invention is directed to system and method for producing carbon nanotubes.

BACKGROUND ART

Carbon nanotubes are hollow cylinders of carbon atoms. Their appearance is that of rolled tubes of graphite, such that their walls are hexagonal carbon rings, and they are often formed in large bundles.

With the possession of metallic conductivity and semiconductor conductivity according to structures, carbon nanotubes are now top candidate to be applied to various technological fields such as, for example, electrodes of electrochemical storage devices (e.g., secondary cells or supercapacitors), electromagnetic shielding, field emission displays or gas sensors.

DISCLOSURE OF INVENTION

Technical Problem

Generally, the production amount of carbon nanotubes (CNTs) is small because hands are still in charge of performing most of their production steps including a step of loading/unloading a CNT-synthesized substrate on/from a reaction tube and a step of unloading the substrate from the reaction tube to retrieve a CNT therefrom. Hence, it is difficult to perform successive process and mass production.

Technical Solution

Exemplary embodiments of the present invention are directed to a system for producing carbon nanotubes. In an exemplary embodiment, the system may include a reaction chamber in which a process is performed for producing a carbon nanotube on a synthetic substrate; a station part disposed at one side of the reaction chamber and provided with a first transporter for loading/unloading the synthetic substrate to/from the reaction chamber; and a substrate accommodating part in which a substrate to be loaded to the reaction chamber is accommodated or a synthetic substrate unloaded from the reaction chamber waits.

In another exemplary embodiment, the system may include a reaction chamber in which a process is performed for producing a carbon nanotube on a synthetic substrate; a station part disposed at one side of the reaction chamber and provided with a first transporter for loading/unloading the synthetic substrate to/from the reaction chamber; a first transporter installed inside the station part for loading/unloading synthetic substrates to/from the reaction chamber; a substrate accommodating part in which a substrate to be loaded to the reaction chamber is accommodated or a synthetic substrate unloaded from the reaction chamber waits; a retrieve part for drawing out a synthetic substrate from the substrate accommodating part to retrieve a carbon nanotube produced on the synthetic substrate; a catalyst coating unit configured for coating a synthetic substrate with a catalyst before the synthetic substrate is accommodated in the substrate accommodating part of the station part; and a second transporter for transporting a synthetic substrate between the retrieve part and the substrate accommodating part and between the catalyst coating unit and the substrate accommodating part.

Exemplary embodiments of the present invention are directed to a method for producing carbon nanotubes. In an exemplary embodiment, the method may include coating a synthetic substrate with a catalyst; loading the substrate coated with the catalyst to a reaction chamber; supplying a source gas to the reaction chamber to synthesizing a carbon nanotube with the synthetic substrate; unloading the processed substrate from the reaction chamber; cooling the unloaded synthetic substrate below a predetermined temperature; and retrieving the carbon nanotube from the cooled synthetic substrate.

Advantageous Effects

As described so far, the present invention has advantages as follows: (1) it is possible to automatically produce carbon nanotubes; (2) it is possible to massively produce carbon nanotubes; (3) since a process of a reaction chamber is continuously maintained, carbon nanotubes of a synthetic substrate are successively synthesized to enhance a system operating rate; (4) a catalyst is supplied automatically precisely to enhance a process reliability; and (5) a carbon nanotube is automatically retrieved to precisely calculate a production rate.

MODE FOR THE INVENTION

Figure 1:
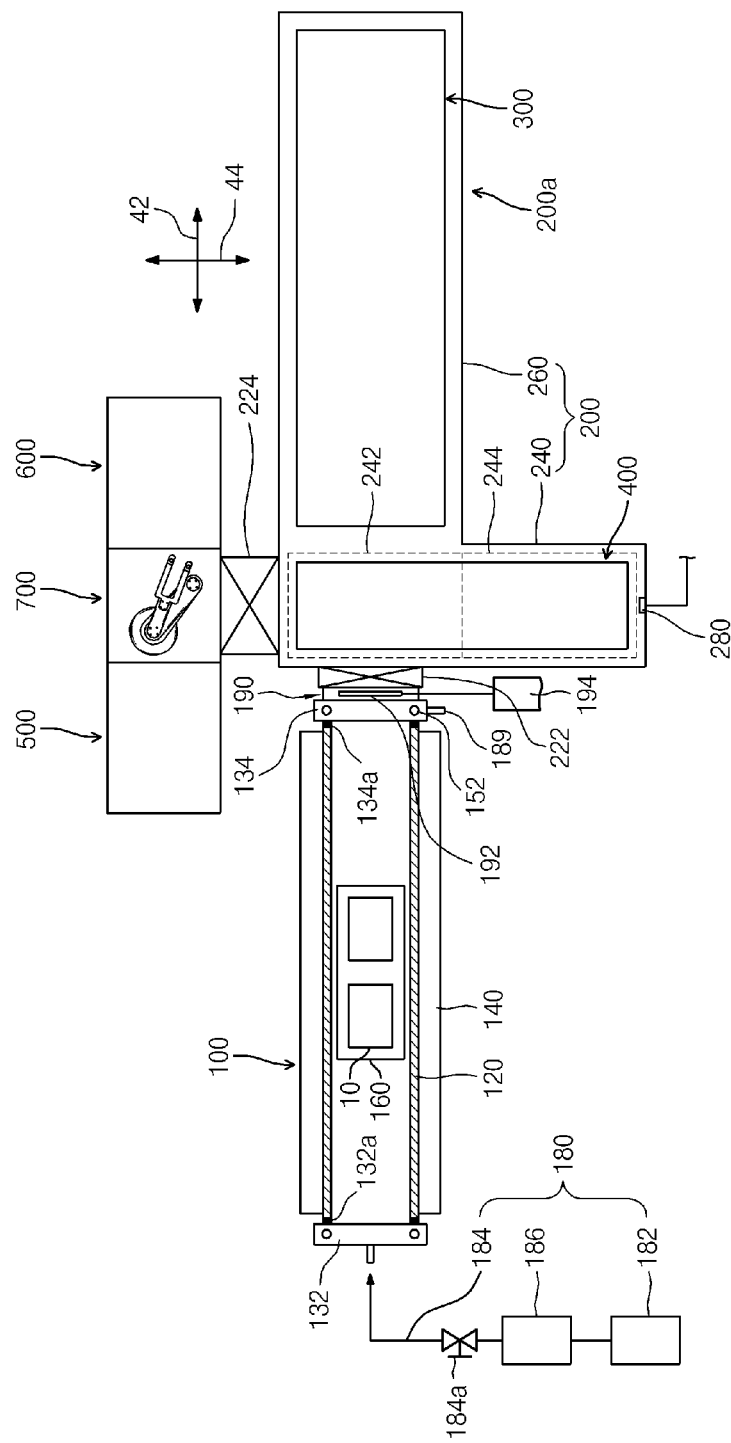
FIG. 1 illustrates a system for producing a carbon nanotube employing a reaction chamber according to the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

An example of a system 1 for producing carbon nanotubes is illustrated in FIG. 1. The system 1 includes a synthetic substrate 10, a reaction chamber 100, and a pre/post processing chamber.

The synthetic substrate 10 is used as a base plate where a carbon nanotube (CNT) is synthesized. The CNT-synthesized substrate may be a silicon wafer, an indium tin oxide (ITO) substrate, an ITO-coated glass, a soda lime glass, a corning glass, and alumina. However, other materials may be used if they have a strength enough to synthesize (grow, produce) a carbon nanotube.

The reaction chamber 100 is provided to perform a process of producing a carbon nanotube on the synthetic substrate 10. The pre/post processing chamber is provided to perform a pre-treating process and a post-treating process for the synthetic substrate loaded/unloaded on/from the reaction chamber 100. The pre-treating process and the post-treating process include a process of coating a catalyst 20 on a synthetic substrate and a process of retrieving a carbon nanotube formed over the synthetic substrate. The pre/post processing chamber includes a station part 200, a first transporter 300, a substrate accommodating part 400, a catalyst coating unit 500, a retrieve part 600, and a second transporter 700.

The station part 200 is provided for preventing a synthetic substrate unloaded from the reaction chamber 100 from being exposed to the air. The first transporter 300 loads/unloads the synthetic substrate on/from the reaction chamber 100. The substrate accommodating part 400 is provided for accommodating the synthetic substrate loaded/unloaded on/from the reaction chamber 100. The catalyst coating unit 500 is provided for coating a catalyst 20 on the synthetic substrate 20 before the synthetic substrate 20 is loaded on the reaction chamber 100. The retrieve part 600 is provided for retrieving the carbon nanotube, which is produced on the synthetic substrate 10 unloaded from the reaction chamber 100, from the synthetic substrate 10. The second transporter 700 transports the synthetic substrate 10 between the substrate accommodating part 400 and the catalyst coating unit 500 and between the substrate accommodating part 400 and the retrieve part 600.

In an exemplary embodiment, the station part 200 is juxtaposed with the reaction chamber 100. The station part 200 has a first region 240 disposed to be adjacent to the reaction chamber 100 and a second region 260 disposed to be opposite to the first region 240. The substrate accommodating part 400 is disposed within the first region 240, and the first transporter 300 is disposed within the second region 260. The reaction chamber 100 and the second region 260 are linearly disposed. The first region 240 has a top region 242 and a bottom region 244. The top region 242 is disposed linearly with the reaction chamber 100 and the second region 260. The bottom region 244 extends from the top region 244 in a first direction 44 which is perpendicular to a second direction 42. The first region 240 and the second region 260 have a rectangular form, respectively. Due to the above-mentioned structure, the station part 200 has a "□" shape entirely. The catalyst coating unit 500, the retrieve part 600, and the second transporter 700 are disposed to be adjacent to the station part 200 and juxtaposed at a position opposed to the bottom region 244, on the basis of the top region 242 of the first region 240, in a direction that is parallel with the second region direction 42. The second transporter 700 is disposed at a position opposed to the first region 240 of the station part 200. Further, the second transporter 700 is sandwiched between the catalyst coating unit 500 and the retrieve part 600. Unlike the foregoing, the shape of the station part 200 and the dispositions of the station part 200, the first transporter 700, the catalyst coating unit 500, the retrieve part 600 may be modified variously.

The elements of the system according to the invention will now be described below in detail.

Referring to FIG. 1, the reaction chamber 100 includes a reaction tube 120, first and second flanges 132 and 134, a heating unit 140, a cooling member 150, a boat 160. The reaction tube 120 is made of a heatproof material such as quartz or graphite. In general, the reaction tube 120 has a cylindrical shape. During a process, the reaction chamber 120 may be maintained at a temperature ranging from 500 degrees centigrade to 1,100 degrees centigrade by the heating unit 140.

The first flange 132 is a disc-shaped flange, which is coupled with the front end of the reaction chamber 120. The second flange 134 is coupled with the back end of the reaction chamber 120. A gas supply member 180 is connected to the first flange 132 for supplying source gas into the reaction tube 120. The gas supply member 180 includes a gas supply source 182, a gas supply pipe 184, and a heating unit 186. The gas supply pipe 184 is coupled with the first flange 132, supplying source gas into the reaction tube 120 from the gas supply source 182. The source gas may be at least one selected from the group consisting of acetylene, ethylene, methane, benzene, xylene, carbon monoxide, and carbon dioxide. A valve 184a is mounted on the gas supply pipe 184 for switching an inner path of the gas supply pipe 184 or controlling a flow rate of the source gas. The heating unit 186 is installed at the gas supply pipe 184 for heating the source gas up to a set temperature before supplying the source gas into the reaction tube 120. Due to the heating unit 186, time required for activating the source gas in the reaction tube 120 may be reduced. Thus, an entire process time may be reduced. After being activated by pyrolysis, the source gas reacts to a catalyst coated on the synthetic substrate 10 to generate a carbon nanotube. An exhaust line 189 is coupled with the second flange 134 for exhausting gas remaining inside the reaction tube 120 after the reaction.

Sealing members 132a and 134a are installed at a contact surface of the first flange 132 and the reaction tube 120 and a contact surface of the second flange 134 and the reaction tube 120 for sealing the interior of the reaction tube 120 from the exterior, respectively. Each of the sealing members 132a and 134a may be an O-ring and is cooled by a cooling member. The cooling member includes a cooling line 152, a cooling water supply pipe 156, and a sensor 158. The cooling line 152 is formed inside the first and second flanges 132 and 134. A cooling fluid flows along the cooling line 152. The cooling fluid is a cooling water. Alternatively, the cooling fluid may be an inert gas. The cooling water flowing along the cooling line 152 cools the sealing members 132a and 134a to prevent the sealing members 132a and 134a from being damaged by the heat inside the reaction tube 120.

Figure 2:
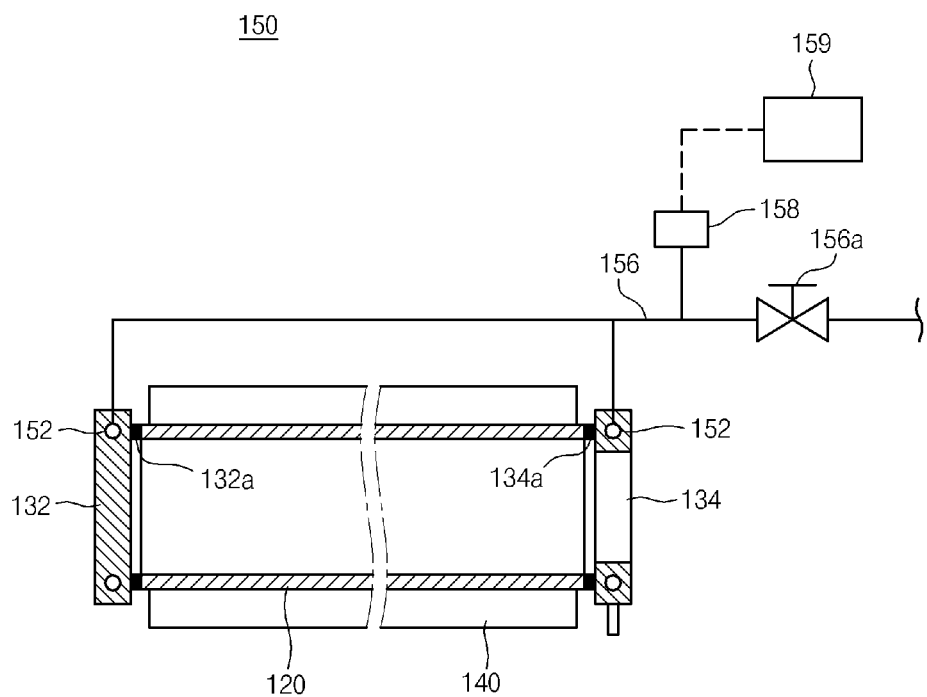
FIG. 2 illustrates a cooling line configured for cooling an O-ring installed at a reaction chamber.

Referring to FIG. 2, a cooling water supply pipe 156 and a cooling water retrieve pipe (not shown) are coupled with the cooling line 152. A valve 156a is mounted on the cooling water supply pipe 156 for switching an interior path of the cooling water supply pipe 156 or controlling a flow rate of a cooling water flowing along the interior path thereof. A sensor 158 is installed at the cooling water supply pipe 156 for measuring a flow rate or a temperature of the cooling water flowing along the interior path of the cooling water supply pipe 156. A signal measured by the sensor 158 is transmitted to a controller 159 for controlling an entire system. The controller 159 analyzes the signal transmitted from the sensor 158. When the analysis result is that the flow rate or temperature of the cooling water is not within a set range for a set time, the controller 159 halts the system or informs a user of this fact through a display or an alarm sound. This enables the sealing members 132a and 134a to continuously perform a process within a predetermined time period even if the cooling water does not flow for a while through the cooling water supply pipe 156 at a set flow rate or a set temperature. The above-mentioned set time is decided considering the time required for affecting the sealing members 132a and 134a when the cooling water does not continue to be supplied smoothly.

The heating unit 140 heats the interior of the reaction tube 120 at a process temperature. The heating unit 140 is installed to surround the outer wall of the reaction tube 120. Heating the reaction tube 120 may be done by means of a heating coil or a heating lamp.

Figure 3:
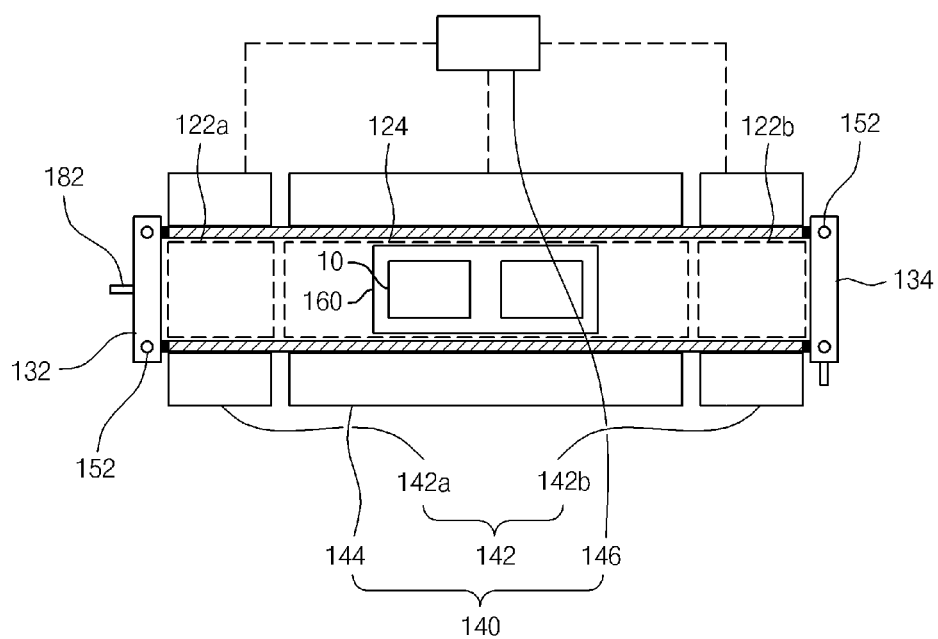
FIG. 3 illustrates a heating unit configured for heating a reaction tube.

FIG. 3 illustrates a reaction chamber 100 including a heating unit 140 according to an exemplary embodiment of the invention. For the convenience of description, regions adjacent to first and second flanges 132 and 134 in the reaction tube 120 are referred to as edge regions 122a and 122b, respectively. Further, a region between the edge regions 122a and 122b is referred to as a central region 124. When an entire region of the reaction tube 120 is heated by one heating unit, a heat temperature of the edge regions 122a and 122b is lower than that of the central region 124. This is because the edge regions 122a and 122b are affected by cooling lines 152 installed at the flanges 132 and 134. Accordingly, the reaction tube 120 is long since synthetic substrates must be provided only to the central region 124 of the reaction tube 120 to perform a process for a synthetic substrate 10 at the same temperature.

As illustrated in FIG. 3, the heating unit 140 includes an edge heater 142, a central heater 144, and a heater controller 146. The edge heater 142 heats the edge regions 122a and 122b, and the central heater 144 heats the central region 124. The heater controller 146 independently controls the central heater 144 and the edge heater 142. The central heater 142 heats the reaction tube 120 at a higher temperature than the central heater 144 such that a temperature is equivalently provided inside the reaction tube 120. The edge heater 142 includes a first heater 142a for heating the edge region 122a adjacent to the first flange 132 and a second heater 142b for heating the edge region 122b adjacent to the second flange 134, which is advantageous to the case where there is a temperature difference between the edge regions 122a and 122b of the reaction tube 120. In this case, the heater controller 146 independently controls the first heater 142a and the second heater 142b.

At least one boat 160 may be provided to the interior of the reaction tube 120. The boat 160 has a sufficient size, so that a plurality of synthetic substrates 10 may be loaded on the boat 160 in a length direction (the above-mentioned second direction 42) of the reaction tube 120. Optionally, the boat 160 may be sized and configured to support a plurality of synthetic substrates 10 lengthwise and clockwise. For example, boats 160 are sized and configured to support two synthetic substrates 10 lengthwise as well as two synthetic substrates 10 clockwise. These boats 160 may be provided to be fixedly installed or loaded/unloaded inside a reaction tube 120.

Alternatively, the boat 160 may be sized to support one synthetic substrate 10. In this case, at least one boat 160 may be provided. In the case where a plurality of boats 160 are provided, they are arranged in the length direction (the above-mentioned second direction 42) of the reaction tube 120 or may be stacked in a direction that is perpendicular to the first direction 42.

Figure 4:
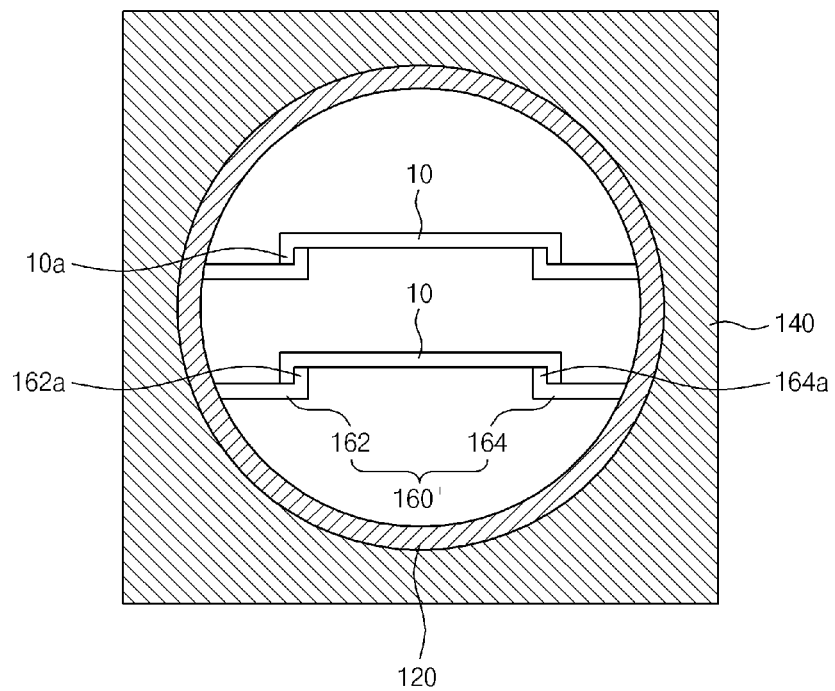
FIG. 4 is a cross-sectional view illustrating an example of a reaction chamber where a supporting frame is installed.
Figure 5:
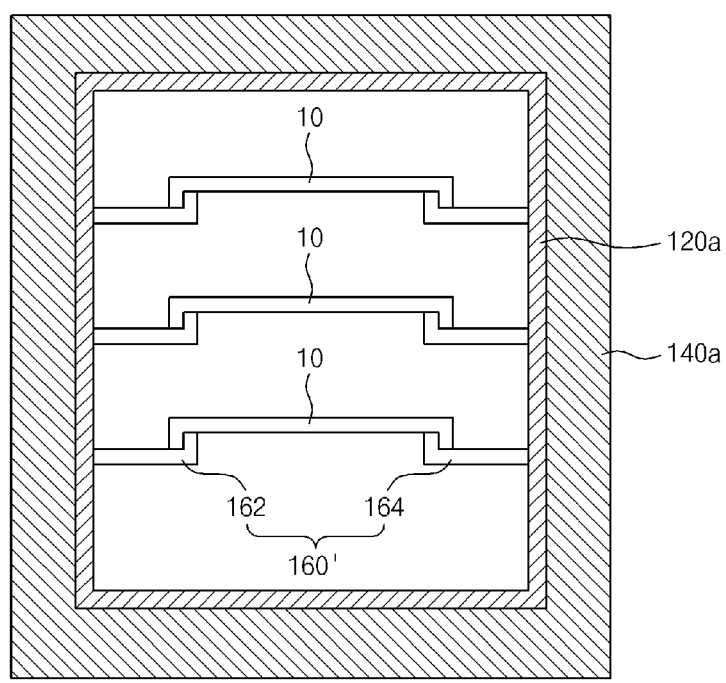
FIG. 5 is a cross-sectional view illustrating another example of a reaction chamber where a supporting frame is installed.

Optionally, a support frame 160' may be installed inside the reaction tube 120 instead of the boat 160. A synthetic substrate 10 is loaded on the support frame 160'. FIG. 4 and FIG. 5 are cross-sectional views of a reaction tube 120 in which a support frame 160' is installed, respectively. Referring to FIG. 4, the support frame 160' includes two frames 162 and 164 provided to protrude inwardly toward the reaction tube 120 from an inner wall of the reaction tube 120 in a length direction of the reaction tube 120. The first and second frames 162 and 164 are oppositely disposed to support the edge of the synthetic substrate 10, respectively. Guide protrusions 162a and 164a, which protrude upwardly, are provided to the ends of the first and second frames 162 and 164 for stably supporting the synthetic substrate 10, respectively. A hitch 10a, which protrude downwardly, may be provided for hitching on the guide protrusions 162a and 164a.

The first frame 162 and the second frame 164 may be long enough to load a plurality of synthetic substrates 10 thereon in a length direction of the reaction tube 120. One or more support frames 160' may be provided to be spaced apart from each other in an up-and-down direction. In the case where the reaction tube 120 is provided to have a circular section, two support frames 160' may be installed up and down. Optionally by providing a support frame 160' having a wider center than the edge, at least three support frames may be provided. Alternatively, as illustrated in FIG. 5, a reaction tube 140a may be provided to have a rectangular section and a plurality of support frames 160' may be provided to be stacked.

In this embodiment, described is a reaction chamber 100 employing pyrolysis of hydrocarbon where hydrocarbon is thermally analyzed to produce a carbon nanotube 30. However, it is merely exemplary and various reaction chambers employing laser deposition, plasma chemical vapor deposition (plasma CVD), thermochemical CVD, frame synthesis, and arc-discharge may be used.

Returning to FIG. 1, the station part 200 includes a chamber 200a isolated from the exterior. A first gate valve 122 is installed between the station part 200 and the reaction chamber 100 to switch a path along which the synthetic substrate 10 travels therebetween. A second gate valve 224 is installed between the station part 200 and the second transporter 700 to switch a path along which the synthetic substrate 10 travels therebetween.

A gas supply member 280 is installed at the station part 200 for supplying inert gas, such as nitrogen and argon, into the station part 200. The inert gas is supplied to remove air (especially oxygen) inside the station part 200 and maintain the interior of the station part 200 at an inert gas ambience. This makes it possible to prevent a high-temperature carbon nanotube 30 produced on the synthetic substrate 10 from being exposed to oxygen when the synthetic substrate 10 is unloaded from the reaction chamber 100 inside the station part 200. The gas supply part 280 is provided to the first region 240 in which the substrate accommodating part 400 is installed.

In the case where the first gate valve 222 is disposed to be adjacent to the reaction chamber 100, it may be damaged due to a radiant heat generated inside the reaction chamber 100.

Accordingly the reaction chamber 100 has a length enough to prevent the damage of the first gate valve 222, which allows a difference between the heating unit 140 and the first gate valve 222 to be maintained sufficiently. However, the enough length of the reaction chamber 100 leads to scale-up of the system 1.

In this embodiment, a heat shield member 180 is installed between the first gate valve 222 and the reaction chamber 100 for suppressing scale-up of the system 1 and preventing the first gate valve 222 from being damaged by radiant heat. The heat shield member 190 shields the heat transferred from the reaction chamber 100. The heat shield member 190 includes a low-heat-conductivity shield plate 192 such as alumina and a driver 194 provided for driving the shield plate 192. Alternatively, the shield plate 192 may be made of a typical metal. In this case, a cooling member (not shown) may be provided for preventing the shield plate 192 from being damaged by the heat inside the reaction chamber 120 and enhancing a shielding efficiency.

While the first gate valve 222, the shield plate 190 is disposed at the front of the first gate valve to prevent the first gate valve 22 from being damaged by heat. When the first gate valve 222 is opened, the shield plate 190 moves to a position not to block an advance path of the synthetic substrate 10.

Figure 6:
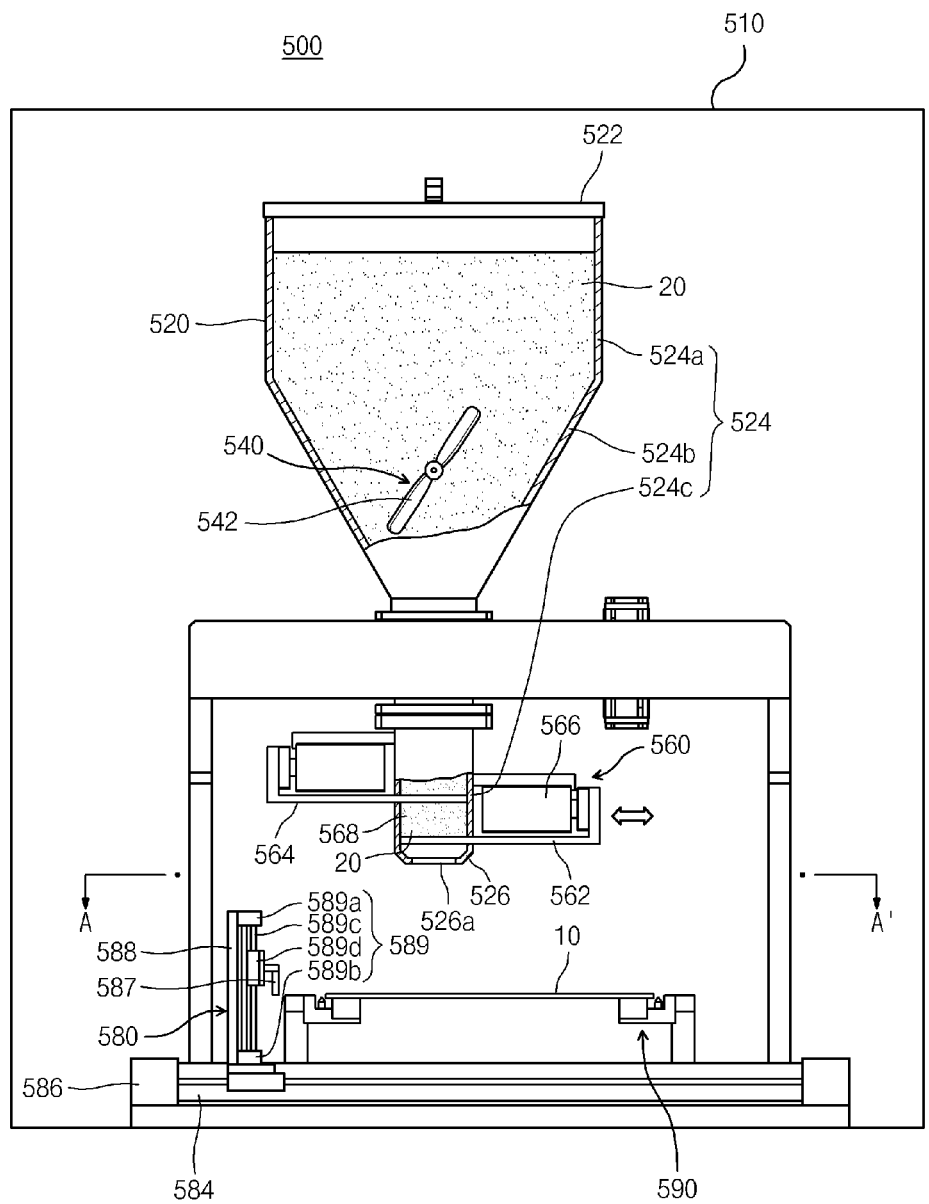
FIG. 6 is a configuration diagram of a catalyst coating unit illustrated in FIG. 1.

Before the synthetic substrate 10 is loaded on the reaction chamber 160, a catalyst (metal layer) 20 is coated on the reaction chamber 160 from the catalyst coating unit 500. FIG. 6 shows a configuration of the catalyst coating unit 500 illustrated shown in FIG. 1, and FIG. 7 is a top plan view of a cross-sectional view taken along a line A-A' of FIG. 6.

Figure 7:
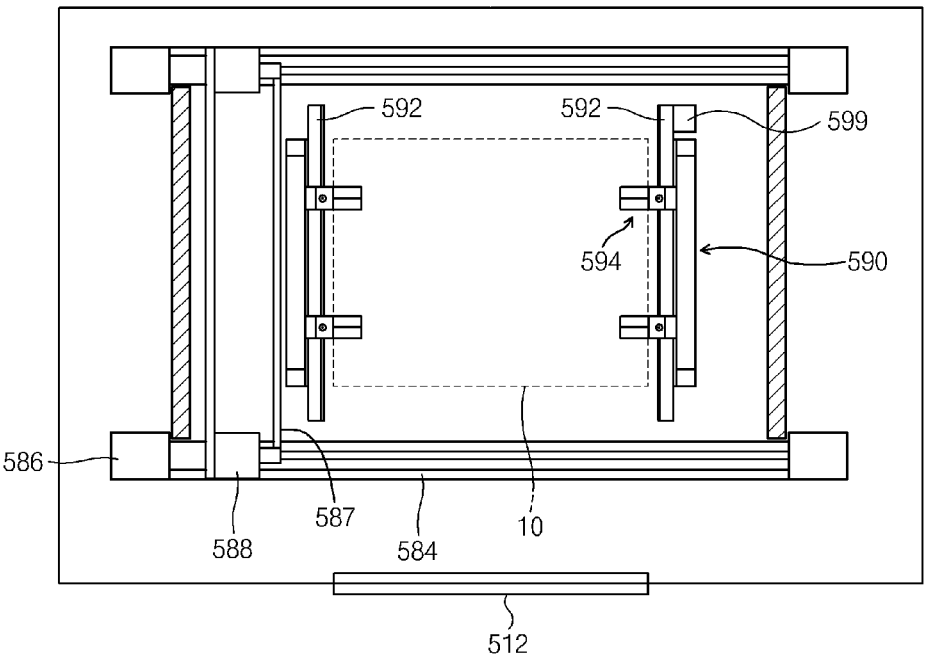
FIG. 7 is a top plan view of a cross-sectional view taken along a line A-A' of FIG. 6.

Referring to FIG. 6 and FIG. 7, the catalyst coating unit 500 includes a catalyst storage tank (hopper) 520, a fixed-amount supply part 560, a brush unit 580, and a stage 590. During a process, a synthetic substrate 10 is loaded on the stage 590. The catalyst storage tank 520 is disposed over the stage 590 and has an output hole 526a configured for supplying the set-amount of catalyst 20 to a top surface of the synthetic substrate 10. The brush unit 580 brushes the catalyst 20 provided to the top surface of the synthetic substrate 10, enabling the catalyst 20 to have a uniform thickness on the top surface of the synthetic substrate 10.

The stage 590 includes side plates 592 spaced at regular intervals to locate the synthetic substrate 10 and facing each other and a plurality of support protrusions 594 installed to protrude inwardly toward the respective side plates 592 and support the edge of the synthetic substrate 10. A plurality of support protrusions 594 may be installed at the respective side plates 592.

The brush unit 580 includes a guide rail 584, a coating brush 587, and a movable body 588. The guide rail 584 is installed lengthwise at both sides of the stage 590 on which the synthetic substrate 10 is loaded. The movable body 588 is movably installed at the guide rail 584 and moves linearly by means of a linear moving driver 586. The linear movement of the movable body 588 is done using a conventional driving method such as a linear motor driving method, a cylinder driving method, and a motor driving method. The coating brush 587 is disposed over the stage 590 for brushing a catalyst so that the catalyst has a uniform thickness on an entire surface of the synthetic substrate 10. Since both ends of the coating brush 587 are connected to the movable body 587, the coating brush 587 travels slidably with the movable body 588. The coating brush 587 may be a metallic or nonmetallic plate having a specific slant side with respect to a forward direction.

The coating brush 587 travels up and down by means of a vertical movement unit 589 such that a height of the coating brush 587 may be adjusted. This enables a coating thickness of the catalyst 20 supplied to the top surface of the synthetic substrate 10 to be regulated. The vertical movement unit 589 includes a top plate 589a fixedly connected with a top surface of the movable body 588, a bottom plate 589b fixedly connected with a bottom surface of the movable body 588 to face the top plate 589a, and a guide axis 589c disposed vertically to connect the top plate 589a with the bottom plate 589b. A bracket 589d is installed at the guide axis 589c. The bracket 589d travels up and down linearly along the guide axis 589c by means of a driver (not shown). The coating brush 587 is fixedly mounted on the bracket 589d.

The catalyst storage tank 520 supplies a stored catalyst 20 onto the synthetic substrate 10. The catalyst storage tank 520 has a top surface 522, a lateral surface 524, and a bottom surface 526 where an output hole 526a is formed. The lateral surface 524 includes an upper portion 524a that is perpendicular roughly, a middle portion 524b that extends downwardly from the upper portion 524a and is bent down inwardly, and a lower portion 524c that extends roughly vertically from the middle portion 524b. Due to the above-described structure, a larger amount of catalyst 20 is stored in a space defined by the upper portion 524a than a space defined by the lower portion 524c at the same height. A shape of the middle portion 524b enables the catalyst 20 stored in the space defined by the top portion 524a to be supplied smoothly to the space defined by the lower portion 524c.

The fixed-amount supply 560 is installed at the catalyst storage tank 520 for supplying the fixed amount of catalyst 20 to the top surface of the synthetic substrate 10. The fixed-amount supply unit 560 includes a top shield plate 564 and a bottom shield plate 562 that are configured for defining a fixed-amount space into which a fixed amount of catalyst 20 is dipped. The top and bottom shield plates 564 and 562 are provided to the bottom portion 524c. The fixed-amount space 568 is disposed over the output hole 526a of the catalyst storage tank 520. The top shield plate 564 is provided over the fixed-amount space 568, and the bottom shield plate 562 is provided therebelow. The top and bottom shield plates 564 and 562 operate by driving means such as a cylinder 566. When the top shield plate 564 is closed while the bottom shield plate 562 is closed, a fixed-amount space 568 is re-defined between the bottom and top shield plates 562 and 564 and filled with the set-amount of catalyst 20.

When the bottom shield plate 562 is opened, the catalyst 20 dipped into the fixed-amount space 568 is supplied to the top surface of the synthetic substrate 10 through the output hole 526a. An agitator 540 is installed at the middle portion 542b of the catalyst storage tank 520 for agitating the catalyst 20. An agitation wing 542 of the agitator 540 rotates before supplying the catalyst 20 to the fixed-amount space 568, eliminating a vacant space inside the catalyst storage tank 520 and inducing the catalyst 20 to be supplied naturally to the fixed-amount space 568.

Figure 8:
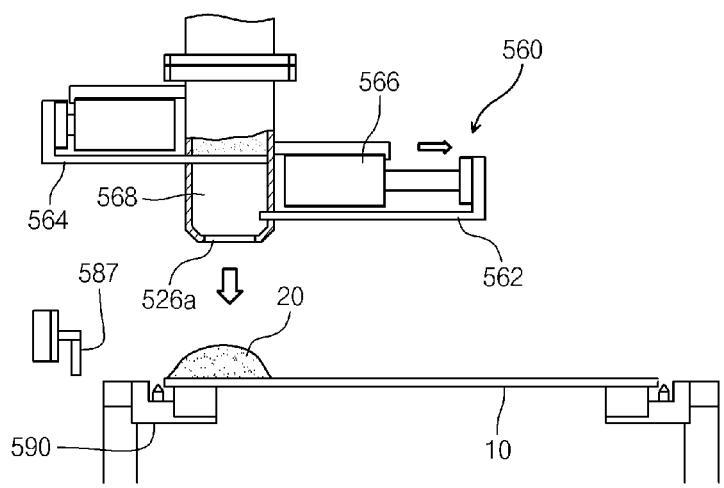
FIG. 8 through FIG. 10 illustrates catalyst coating steps at a catalyst coating unit.
Figure 9:
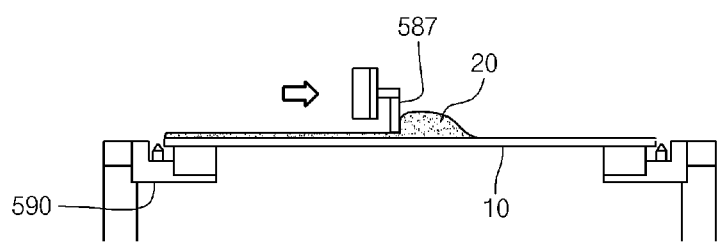
Figure 10:
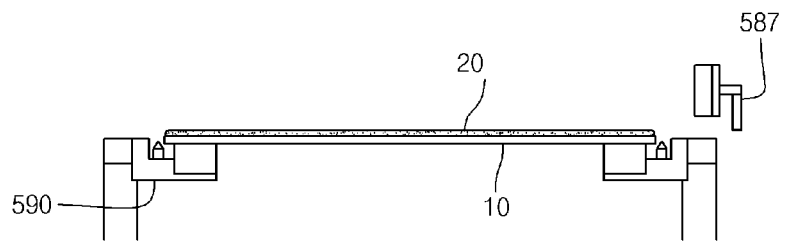

The catalyst coating steps of the catalyst coating unit 500 will now be described with reference to FIG. 8 through FIG. 10. When the synthetic substrate 10 is loaded on the stage 590 by a second transporter 700, the bottom shield plate 562 operates by the cylinder 566 to open the bottom of the fixed-amount space while traveling in a side direction. The set-amount of catalyst 20 dipped into the fixed-amount space 568 drops on a top surface of the synthetic substrate 10 (see FIG. 8). An entire surface of the synthetic substrate 10 is coated with the catalyst 20 accumulated on the top surface of the substrate 10 by means of the brush unit 580 (see FIG. 9 and FIG. 10). That is, the coating brush 587 conformally coats the entire surface of the synthetic substrate 10 with the catalyst 20 while slidably traveling from one end of the synthetic substrate 10 to the other end thereof. In order to conformally coat the catalyst 20, a vibrator (not shown) may be installed for applying minute vibration to the coating brush 587 or the synthetic substrate 10.

The catalyst 20 may be a powder made by mixing a transition metal (e.g., iron, platinum, cobalt, nickel, yttrium or combination thereof) with a porous substance (e.g., MgO, Al2O3 or SiO2). Alternatively, the catalyst 20 may be a liquid catalyst including the above-mentioned substances. In the event that the catalyst 20 is a liquid catalyst, a system may include a catalyst storage tank, a supply line, a fixed-amount supply pump mounted on the supply line, and a supply nozzle configured for supplying the liquid catalyst to a top surface of a synthetic substrate.

According to the above embodiment, the coating brush 587 conformally coats the top surface of the synthetic substrate 10 with the catalyst 20 while traveling on the top surface thereof. Unlike this, the coating brush 587 is fixed and the stage 590 may travel. Preferably, the coating brush 587 travels to reduce a space of the catalyst coating unit 500.

Also according to the above embodiment, the catalyst 20 is separately coated on the synthetic substrate 10 by the catalyst coating unit 500, and a carbon nanotube 30 is produced on the synthetic substrate 10 coated with the catalyst 20 inside the reaction chamber 100. Unlike this, a catalyst coating unit may be removed and a catalyst gas and a source gas may be supplied to coat a catalyst and produce a carbon nanotube on a top surface of a synthetic substrate inside a reaction chamber.

Figure 11:
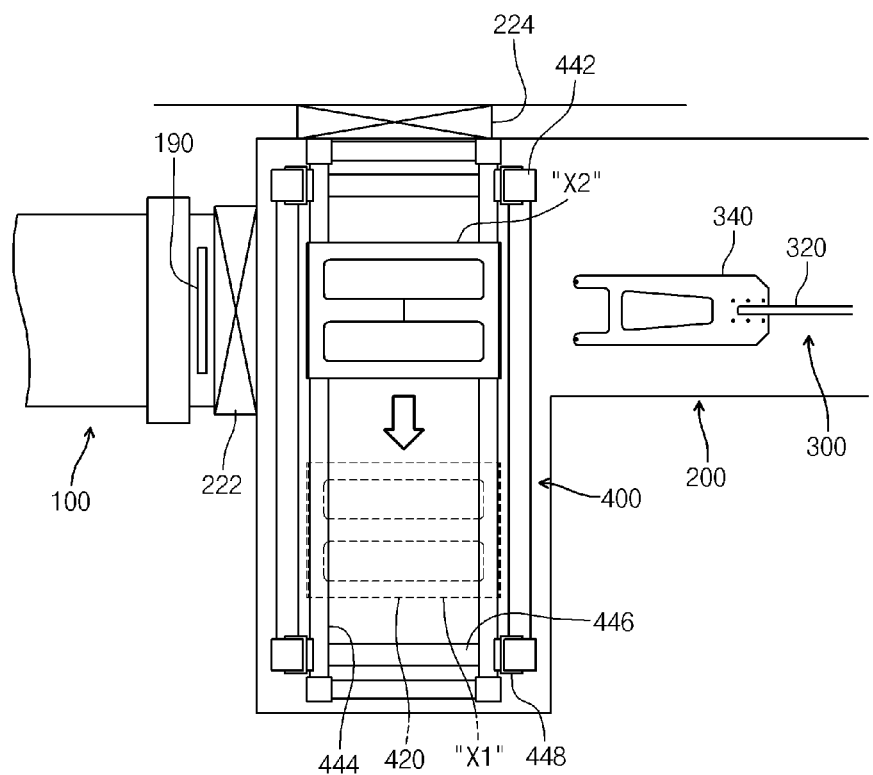
FIG. 11 is a top plan view of a substrate accommodating part and a first transporter illustrated in FIG. 1.
Figure 12:
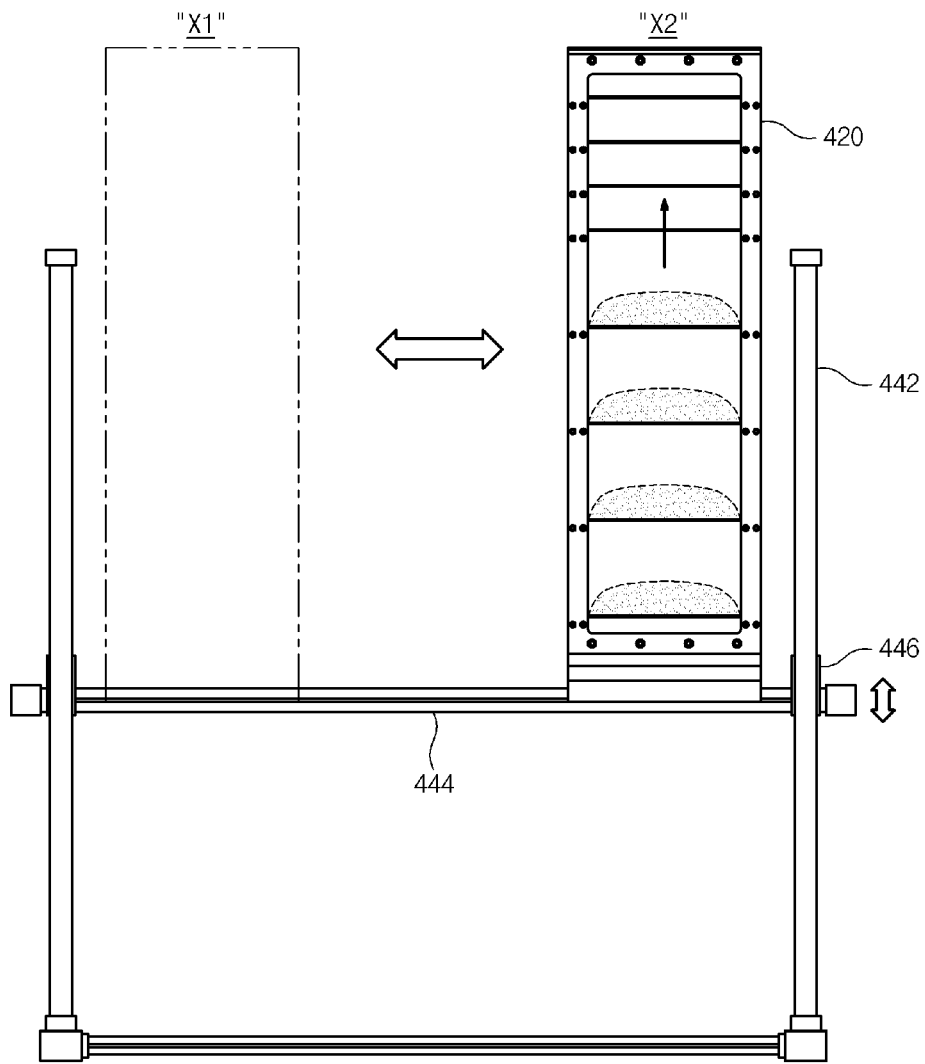
FIG. 12 is a side view of the substrate accommodating part.

FIG. 11 is a top plan view of the substrate accommodating part 400 and the first transporter 300, and FIG. 12 is a side view of the substrate accommodating part 400. The substrate accommodating part 400 includes a cassette 420 configured for accommodating a synthetic substrate 10, vertical rails 442, a horizontal rail 444, and movable frames 446. The vertical rails 442 are disposed at corners of a first region 240, respectively. Each of the vertical rails 442 has a shape of a perpendicularly long rod for guiding an up-and-down movement of the movable frame 446. A bracket 446 is coupled with the respective vertical rails 442 and travels up and down along the vertical rail 442 by a vertical driver (not shown). The respective movable frames 446 are provided lengthwise in a first direction 42 and are disposed to face each other. The movable frame 446 gears with the bracket 448 to linearly travel up and down along the vertical rail 442 with the bracket 448. The horizontal rail 444 is fixedly installed on the movable frame 446. The respective horizontal rails 444 is provided lengthwise in a second direction 44 and disposed to face each other. The horizontal rail 444 is provided throughout the first region 240. The cassette is mounted on the horizontal rail 444 to be movable along the horizontal rail 444 in the second direction 44.

As illustrated in FIG. 11, the cassette 420 travels horizontally between a wait position X1 denoted by a dotted line and a loading/unloading position X2 (just front of a first gate valve connected to a reaction chamber). The wait position X1 exists in a bottom region 244 of the first region 240, and the loading/unloading position X2 exists in a top region 242 thereof. The cassette 420 travels to the loading/unloading position X2 when the synthetic substrate 10 is loaded/unloaded to/from the reaction chamber 100 and when the synthetic substrate 10 is transported by the second transporter 700. Also the cassette 420 travels to the wait position X1 when waiting to drop a temperature of the synthetic substrate 10.

Figure 13:
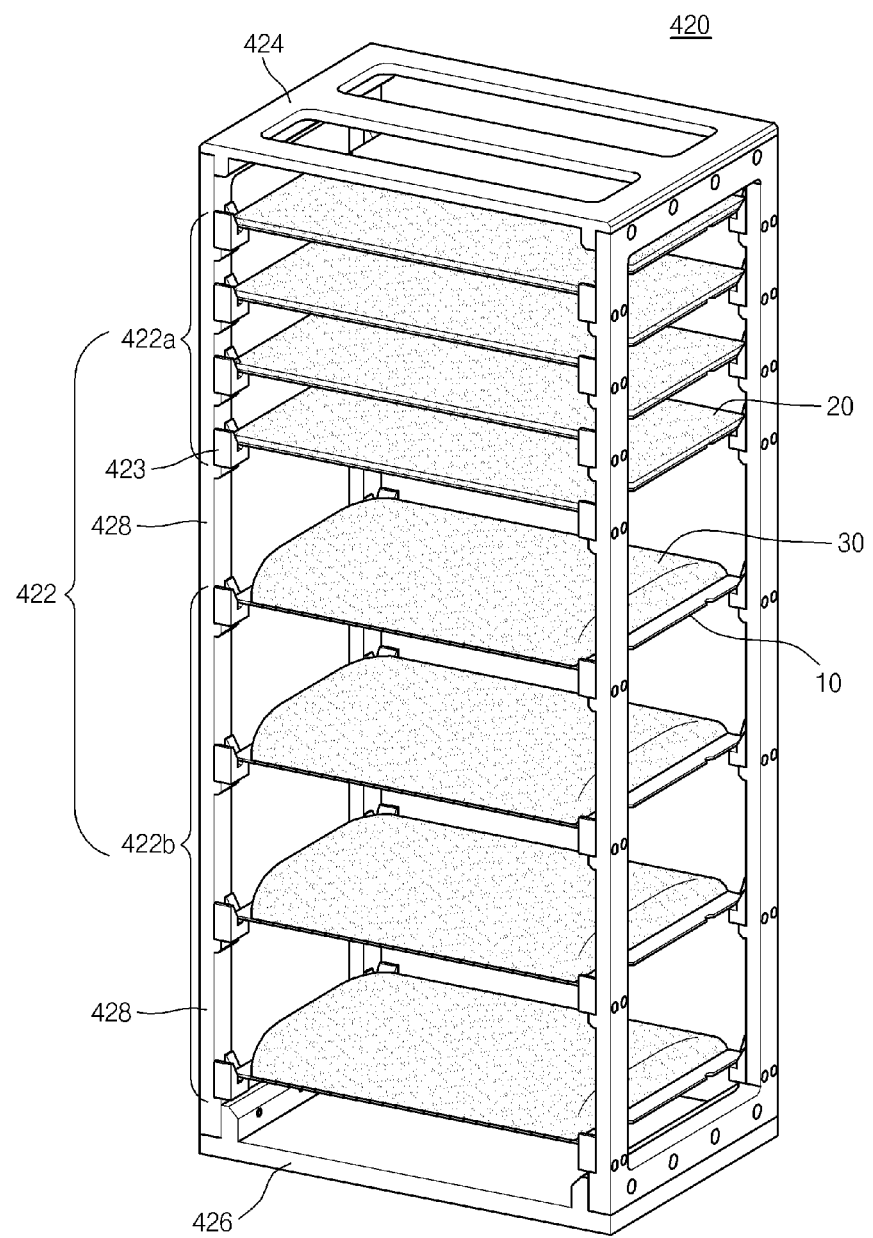
FIG. 13 is a perspective view of the first transporter.

FIG. 13 is a perspective view of the cassette 420. A synthetic substrate to be loaded to a reaction chamber 100 and synthetic substrates 10 unloaded from the reaction chamber 100 are accommodated in the cassette 420. Referring to FIG. 13, the cassette 420 includes supports 422, a top plate 424, a bottom plate 426, and vertical axes 428. The top and bottom plates 424 and 426 are rectangular plates facing each other. The vertical axes 428 connect corresponding corners of the top and bottom plates 424 and 426 with each other. Accordingly, four vertical axes 428 are provided. The supports 422 are installed at the vertical axes 428 to accumulate and accommodate the synthetic substrates 10 in the cassette 420. Each of the supports 422 has four supporting blocks 423 for supporting corner portions of the synthetic substrate 10. The supports 422 are segmented into two groups with a first group including first supports 422a and a second group including second supports 422b. The first supports 422a support the synthetic substrates 10 to be loaded to the reaction chamber 10, and the second supports 422b support synthetic substrates 10 unloaded from the reaction chamber 10. In an exemplary embodiment, four first support 422a and four second support 422b are provided and the first supports 422a is disposed over the second supports 422b.

A space between the second supports 422b is larger than that between the first supports 422a, which makes it possible to reduce an entire height of the cassette 420 and offer a space enough to prevent the carbon nanotube 30 produced on an entire surface of the synthetic substrate unloaded from the reaction chamber 100 from contacting an adjacent synthetic substrate 10.

The synthetic substrates 10 accommodated at the first support 422a of the cassette 420 are loaded into the reaction chamber 100 by the first transporter. Four synthetic substrates 10 are loaded on a boat 160 of the reaction chamber 100. The first transporter 300 loads/unloads synthetic substrates to/from the reaction chamber 100 one after another.

If loading the synthetic substrates 10 is completed, a process is performed inside the reaction chamber 100 for producing a carbon nanotube 30. During the process, other four synthetic substrates 10 wait at the first supports 422a of the cassette 420 after being coated with a catalyst.

If the process for producing a carbon nanotube 30 is completed inside the reaction chamber 100, a high-temperature synthetic substrate 10 is unloaded from the reaction chamber 100 by the first transporter 300 to be accommodated at the second support 422b of the cassette. The high-temperature synthetic substrate 10 is cooled at the second support 422b for a predetermined time. Cooling the high-temperature synthetic substrate 10 is conducted by means of natural cooling. Alternatively, the cooling may forcibly be conducted using cooling means such as cooling water.

When the synthetic substrates 10 on which the carbon nanotubes 30 is produced are fast drawn out of the reaction chamber 100 (without being cooled by a predetermined temperature), four synthetic substrates 10 waiting at the first support 422a of the cassette 420 (to produce a carbon nanotube 30) are loaded to the reaction chamber 100. Likewise in the reaction chamber 100, while a temperature of a reaction tube 120 is maintained at a process temperature, synthetic substrates 10 are fast loaded to omit a step of raising the reaction tube 120 up to the process temperature.

The synthetic substrates on which the carbon nanotubes 30 are produced wait at the second supports 422b of the cassette 420 until dropping below a predetermined temperature. The cassette 420 at which the synthetic substrates 10 wait are disposed inside a station part 200. Since the interior of the station part 200 is filled with inert gas, the synthetic substrates 10 waiting at the cassette 10 are not in contact with external gases (especially, air). While the synthetic substrate processed in the reaction chamber 100 drops below a predetermined temperature, no problem occurs. However, if a high-temperature synthetic substrate 10 is exposed to the air of room temperature, the carbon nanotube 30 produced on a surface of the synthetic substrate 10 reacts to oxygen of the air to be deformed. To suppress the deformation of the carbon nanotube 30, the station part 200 filled with inert gas is provided for preventing the synthetic substrates 10 unloaded from the reaction chamber 10 from contacting oxygen.

The synthetic substrates 10 waiting at the second supports 422b of the cassette 420 for a predetermined time are transported to a retrieve part 600 by a second transporter 700 through a second gate valve 224. The retrieved synthetic substrate 10 is accommodated at the first support 422a of the cassette after being coated with a catalyst 20 by a catalyst coating unit 500.

In the system according to the present invention, eight synthetic substrates are segmented into two groups and alternately subjected to a process of synthesizing a carbon nanotube 30 in a reaction chamber. Thus, the processing amount may be enhanced to achieve mass production.

Figure 14:
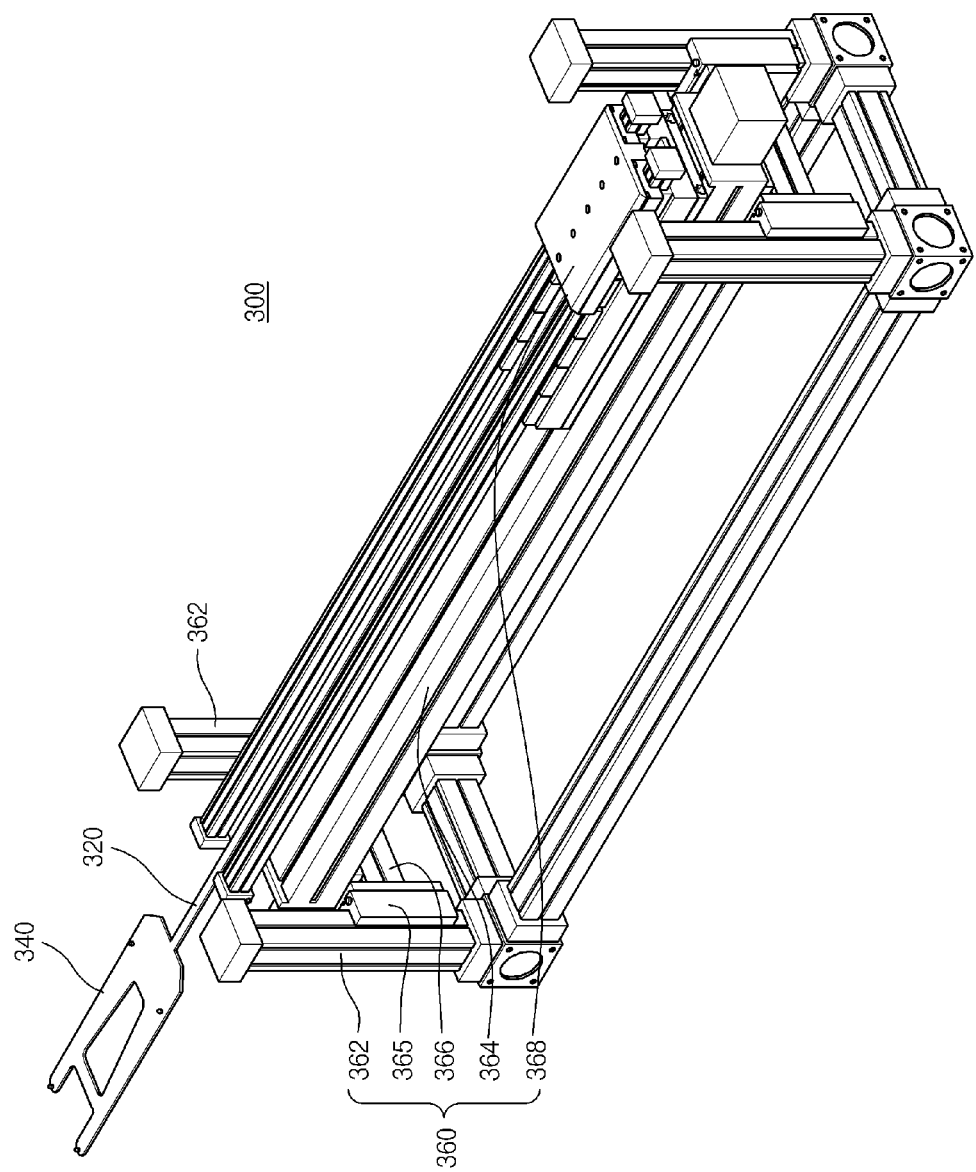
FIG. 14 is a perspective view of a cassette of the substrate accommodating part.

FIG. 14 is a perspective view of a first transporter 300. The first transporter 300 includes an arm 320, a blade 340, and a driver 360. The driver 360 includes vertical rails 362, a horizontal rail 364, movable frames 366, and a movable block 368. The vertical rails 362 are disposed at corner portions of a second region 260, respectively. Each of the vertical rails 362 has a shape of a lengthwise-long rod to guide an up-down movement of the movable frame 366. A bracket 365 is coupled with each of the vertical rails 362 and travels up and down by means of a vertical driver (not shown). The movable frames 366 are provided long in a second direction 44 to face each other. The movable frame 366 gears with the bracket 365 to linearly move up and down along the vertical rail 362 with the bracket 365. Each of the movable frames 366 has both ends that are fixedly installed at the facing brackets 365 in the second direction 44, and the movables frames 366 moves up and down with the bracket 365. The horizontal rail 364 is fixedly installed over the movables frames 366. Each of the horizontal rails 364 is provided long in a first direction 42. The horizontal rail 364 is provided throughout the second region 260, and the movable block 368 is mounted on the horizontal rail 364 to be movable along the horizontal rail 364 in the second direction 44. The arm 320 is fixedly installed at the movable block 368 and provided long in the first direction. The blade 340 is installed at the end of the arm 320 for supporting the synthetic substrate 10.

The first transporter 300 includes a cooling member 330 provided for cooling the arm 320. In the case where the reaction tube 120 is long, a long arm 320 is used to load/unload a synthetic substrate 10. However, since the interior of the reaction tube 120 is maintained at a very high temperature, the reaction tube 120 is expanded by heat when the arm 320 goes into the reaction tube 120. Thus, the synthetic substrate 10 is loaded at not a set position but a deviating position on the blade 340. While the synthetic substrate 340 is transported from the set position on the blade 340, it may deviate from the blade 340 or be loaded on the cassette 420 after deviating from the set position.

Figure 15:
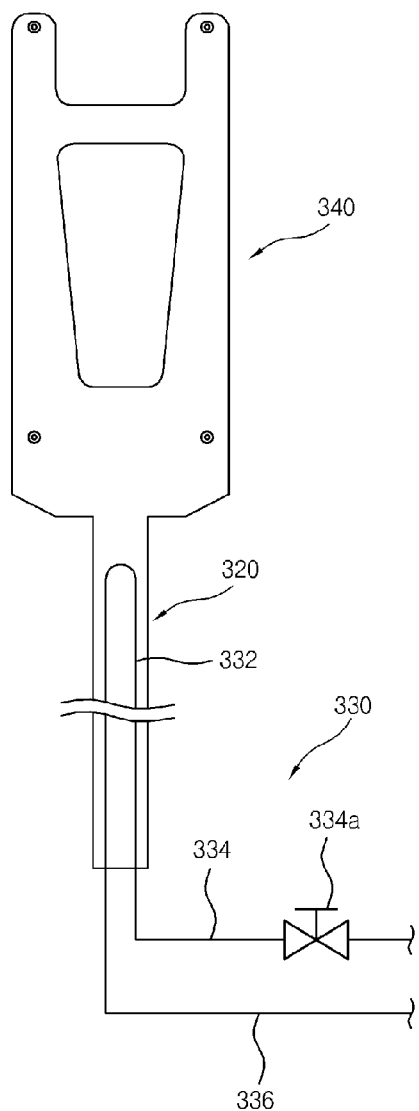
FIG. 15 illustrates a cooling member configured for cooling an arm illustrated in FIG. 14.

The cooling member 330 is provided to prevent the arm 320 from being damaged by heat when the arm 320 goes into the reaction tube 120. FIG. 15 illustrates a first transporter 300 provided for the cooling member 330. The cooling member 330 includes a cooling line 332, a cooling water supply pipe 334, and a cooling water retrieve pipe 336. The cooling line 332 is provided into the arm 320 in a length direction of the arm 320. The cooling water supply pipe 334 is connected to one end of the cooling line 332 for supplying a cooling water to the cooling line 332, and the cooling water retrieve pipe 336 is connected to the other end thereof for retrieving the cooling water from the cooling line 332. A valve 334a is mounted on the cooling water supply pipe 334 for opening or closing an inner path of the pipe 334 or controlling a flow rate of the cooling water.

The completely processed synthetic substrate 10 is headed at a high temperature. When the blade 340 waiting at the station part 200 contacts the heated synthetic substrate 10 to unload the heated synthetic substrate 10 from the reaction tube 120, the synthetic substrate 10 may be damaged due to a rapid change of temperature. Thus, a contact area between the blade 340 and the synthetic substrate 10 should be reduced.

Figure 16:
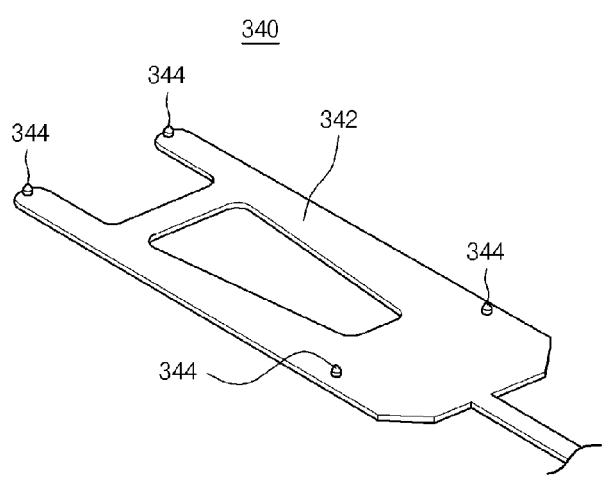
FIG. 16 is a perspective view of a blade illustrated in FIG. 15.

FIG. 16 is a perspective view of the blade 340 shown in FIG. 15. The blade 340 includes a plate 342 having a flat top surface and protrusions 344 protruding upwardly from the plate 342 to contact a synthetic substrate 10. The plate 342 is made of a superior-heatproof material because it goes into the reaction tube 120 to unload/unload the synthetic substrate 10 during a process. The protrusions 344 are uniformly provided to a corner region or an entire region of the plate 342 for reducing a contact area between a blade and a synthetic substrate.

Figure 17:
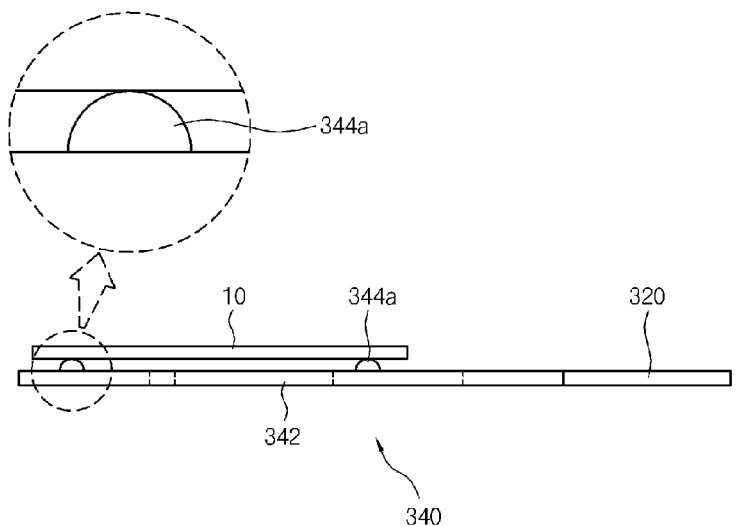
FIG. 17 through FIG. 19 illustrate various examples of a projection formed at a blade.
Figure 18:
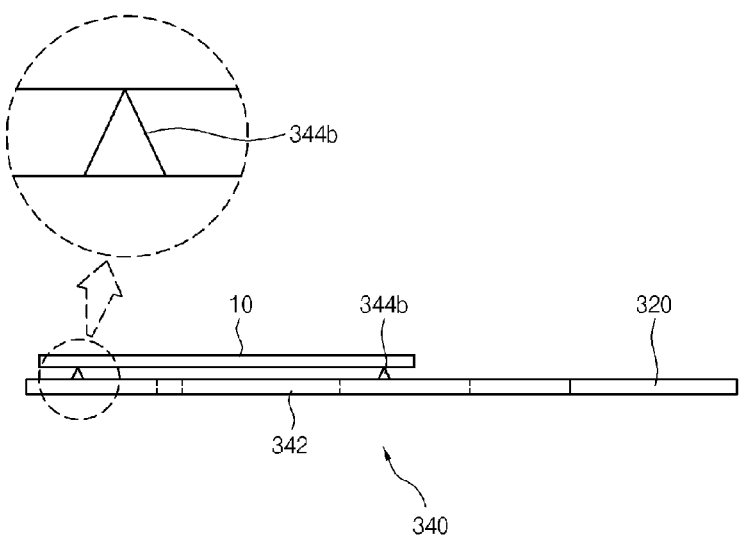
Figure 19:
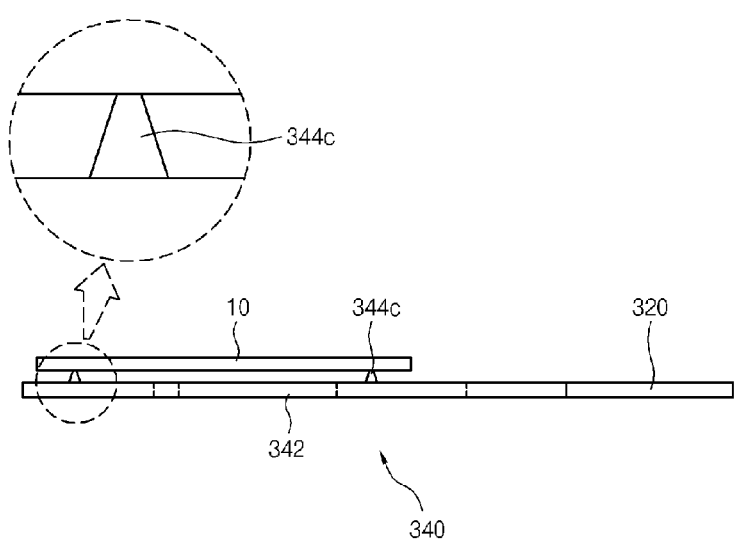

As illustrated in FIG. 17 and FIG. 19, each protrusion 344a has a shape of hemisphere or polypyramid to be in point contact with a synthetic substrate 10. Alternatively, as illustrated in FIG. 19, each protrusion 344a has a shape of circular truncated cone or polyprism to be in surface contact with a synthetic substrate 10.

The shape of the protrusion 344 may be modified or altered and is not limited to the foregoing embodiments. The protrusion 344 is provided for preventing the synthetic substrate 10 from being damaged by a rapid change of temperature. The protrusions 344 may change variously in shape, number, and arrangement.

The synthetic substrates cooled at the second supports 444 of the cassette 420 for a predetermined time are transported to the retrieve part 600 by the second transporter 700.

Figure 20:
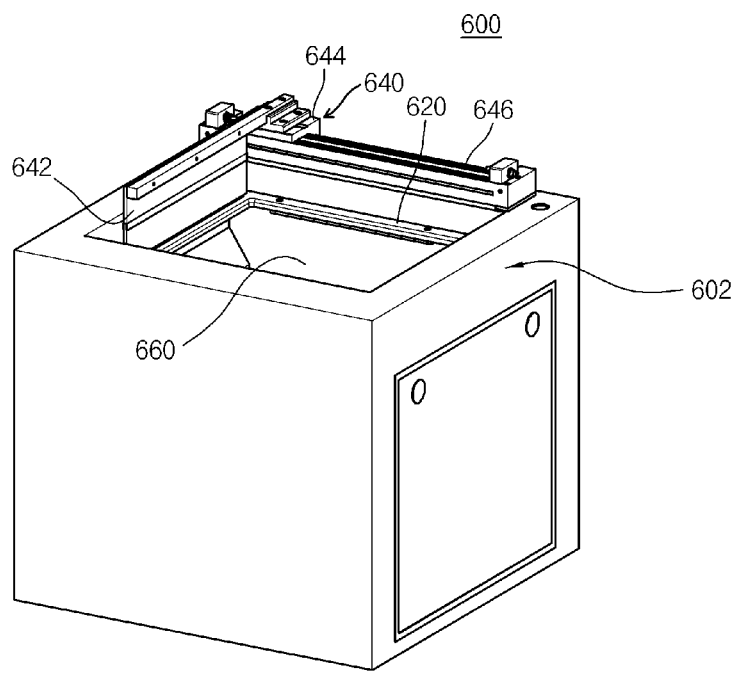
FIG. 20 is a perspective view of a retrieve part.
Figure 21:
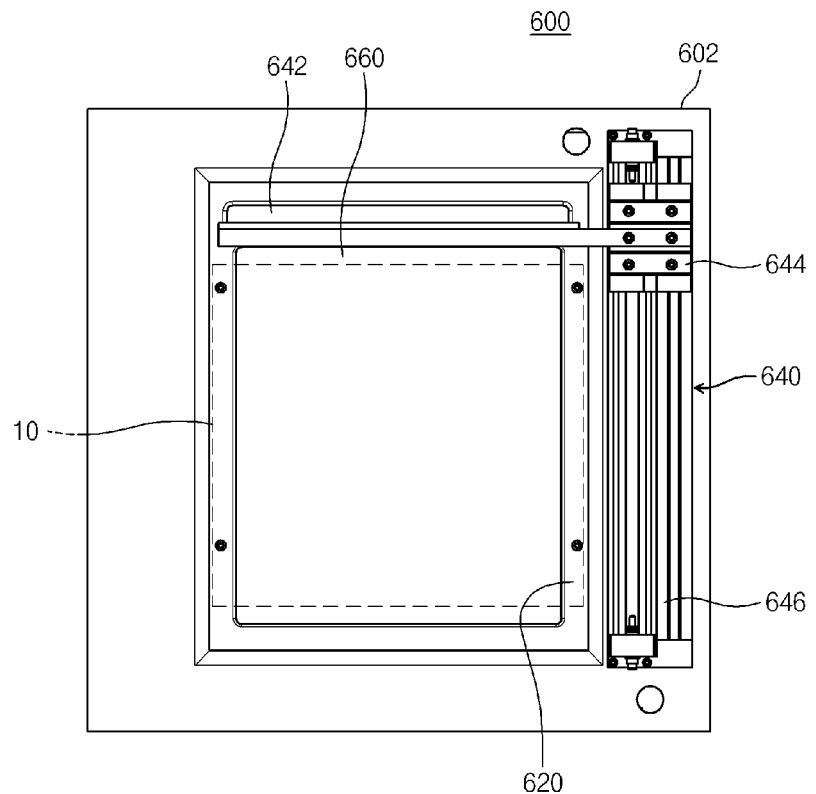
FIG. 21 is a top plan view of the retrieve part illustrated in FIG. 20.
Figure 22:
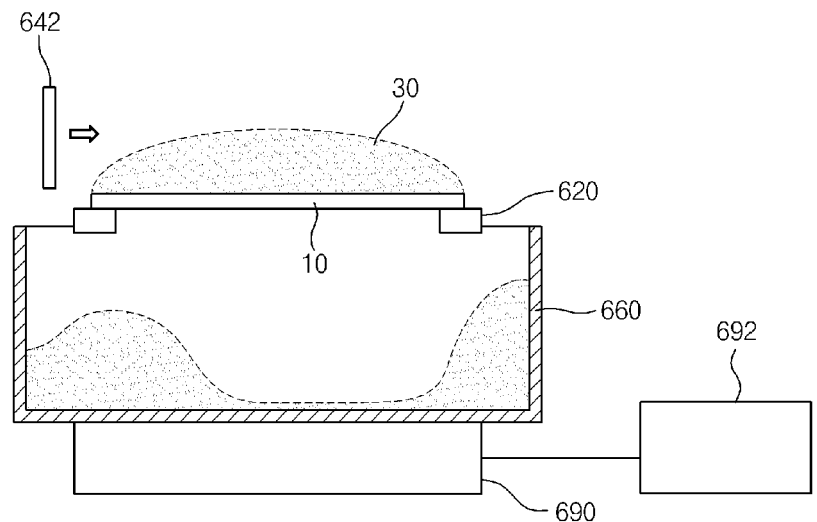
FIG. 22 illustrates steps of retrieving a carbon nanotube at a retrieve part.

FIG. 20 and FIG. 21 are a perspective view and a top plan view of a retrieve part 600, respectively. FIG. 22 is a diagram illustrating a retrieve procedure of a carbon nanotube 30 in a retrieve part.

Referring to FIG. 20 and FIG. 22, the retrieve part 600 includes a stage on which a synthetic substrate 10 is loaded. Beneath the stage 620, a retrieve container 660 is disposed in which a carbon nanotube 30 retrieved from a synthetic substrate 10 is stored. A retrieve unit 640 is disposed at the stage 620 for brushing the carbon nanotube 30 to the retrieve container 660 from a top surface of the synthetic substrate 10. The retrieve unit 640 is provided with a guide rail 646 installed in a length direction of the synthetic substrate 10. A movable body 644 is installed at the guide rail 646. A retrieve brush 642 is installed at the movable body 644 for brushing the carbon nanotube 30 on the top surface of the synthetic substrate 10 to the retrieve container 660 while slidably traveling from one side of the synthetic substrate 10 in a length direction. A height of the retrieve brush 642 is adjustable at the movable body 644.

In the above embodiment, described is that the retrieve brush 642 brushes a catalyst on a synthetic substrate 10 while traveling. Alternatively, the retrieve brush 642 may be fixed and a stage may travel. Preferably, the retrieve brush 642 travels to reduce a space of the retrieve part 600.

Quantity of the carbon nanotube 30 stored in the retrieve container 660 can be measured by a measuring part 690 provided below the retrieve container 660, and quantity of the carbon nanotube 30 measured by the measuring part 690 is displayed by a display part 692 is connected to the measuring part 690.

The synthetic substrate 10 where the carbon nanotube 30 is retrieved is provided to the catalyst coating unit 500 by the second transporter 700 to be subjected to the above-described coating process. The synthetic substrate 10 coated with a catalyst is accommodated at the first support 422a of the cassette 420.

Figure 23:
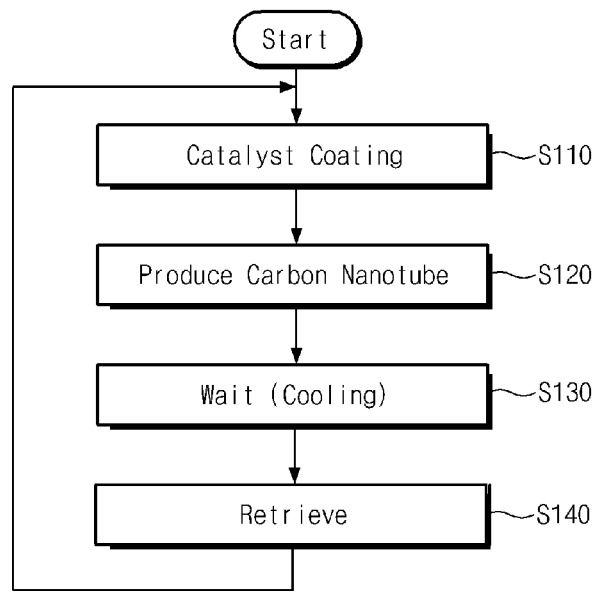
FIG. 23 is a flowchart illustrating steps of generating a carbon nanotube using a system.

Referring to FIG. 23, the system for massively producing the above-described carbon nanotubes 30 performs a catalyst coating process (S110), a process of producing a carbon nanotube 30 (S120), a wait (cooling) process (S130), and a retrieve process (S140). In the S110, when a dose of catalyst 20 is applied to a top surface of a synthetic substrate 10 from a catalyst storage tank 520, a coating brush 587 of a brush unit 580 conformally distributes the catalyst 20 to the top surface thereof while traveling. The synthetic substrate 10 coated with the catalyst 20 is accommodated in a cassette 420 of a substrate accommodating part 400 installed at a station part 200 by a first transporter 300. The synthetic substrate 10 accommodated at a first support 422a of the cassette 420 is loaded on a boat 160 of a reaction chamber 100 by a first transporter 300 shortly after the processed synthetic substrate 10 is unloaded from the reaction chamber 100. When loading the synthetic substrate 10 is completed, a process is performed inside the reaction chamber 100 to produce a carbon nanotube 30 (S120). After synthetic substrates 10 unloaded from the reaction chamber 100 are accommodated at a second support 422b of the cassette 420, they are cooled for a pre-determined time (S130). After the predetermined time, the synthetic substrates 10 is drawn out of the station part 400 to be transported to the retrieve part 600 (S140). The synthetic substrate 10 retrieving the carbon nanotube 30 in a retrieve part 600 is transported to a catalyst coating part 500 to be accommodated at the first support 422a of the cassette 420 after being coated with the catalyst 20. The synthetic substrates 10 processed inside the reaction chamber 100 are repeatedly subjected to the above-mentioned processes after being accommodated at the second support 422b of the cassette 420.

Industrial Applicability

As described so far, the present invention has advantages as follows: (1) it is possible to automatically produce carbon nanotubes; (2) it is possible to massively produce carbon nanotubes; (3) since a process of a reaction chamber is continuously maintained, carbon nanotubes of a synthetic substrate are successively synthesized to enhance a system operating rate; (4) a catalyst is supplied automatically precisely to enhance a process reliability; and (5) a carbon nanotube is automatically retrieved to precisely calculate a production rate.

The invention claimed is:

1. A system for producing carbon nanotubes, comprising:
   a plurality of synthetic substrates:
   a reaction chamber in which a process is performed for producing carbon nanotubes on the plurality of synthetic substrates;
   a processing chamber in which a pre-treating process and a post-treating process are performed, wherein the pre-treating process applies catalysts on the plurality of synthetic substrates and the post-treating process retrieves carbon nanotubes formed on the plurality of synthetic substrates; and
   a first transporter configured for transporting the plurality of synthetic substrates continuously between the reaction chamber and the processing chamber;
   wherein the processing chamber includes a substrate accommodating part for accommodating the plurality of synthetic substrates before they are loaded to the reaction chamber and after they are unloaded from the reaction chamber, the substrate accommodating part comprising: a cassette having first supports adapted to accommodate the plurality of synthetic substrates before they are loaded to the reaction chamber and second supports adapted to accommodate the plurality of synthetic substrates after they are unloaded from the reaction chamber.

2. The system of claim 1, wherein the processing chamber includes a station part disposed at one side of the reaction chamber comprising: a chamber isolated from the outside to prevent the plurality of synthetic substrates unloaded from the reaction chamber from contacting oxygen.

3. The system of claim 2, wherein the station part further comprises: a gas supply member configured for supplying inert gas to an internal space of the station part.

4. The system of claim 1, wherein the first supports are stacked on the second supports, and spaces of the Second supports are larger than those of the first supports.

5. The system of claim 4, wherein the cassette further comprises vertical axes and protrusion members protruded from the vertical axes to support the first supports and the second supports.

6. The system of claim 1, wherein the cassette is installed to be movable upward and downward within the substrate accommodating part.

7. The system of claim 1, wherein the processing chamber includes a catalyst coating unit configured for coating a top surface of at least one of the plurality of synthetic substrates with a catalyst before the at least one of the plurality of synthetic substrates is transported to the reaction chamber.

8. The system of claim 7, wherein the catalyst coating unit comprises:
   a catalyst storage tank having an output hole configured for supplying a pre-determined amount of catalyst to the top surface of the at least one of the plurality of synthetic substrates; and
   a brush unit for brushing the catalyst so that the catalyst supplied to the top surface of the at least one of the plurality of synthetic substrates has a uniform thickness on an entire surface thereof.

9. The system of claim 8, wherein the catalyst storage tank comprises: a fixed-amount supply part for a preset amount of catalyst to the top surface of the at least one of the plurality of synthetic substrates.

10. The system of claim 9, wherein the fixed-amount supply part offers a fixed-amount space where the preset amount of catalyst is dipped into an upper portion of the output hole of the catalyst storage tank and includes a top shield plate and a bottom shield plate which are movable; and wherein when the top shield plate is opened, the dipped catalyst is supplied to the top surface of the at least one of the plurality of synthetic substrates through the output hole.

11. The system of claim 9, wherein the brush unit comprises:
   a guide rail installed in a length direction of the at least one of the plurality of synthetic substrates;
   a movable body installed to be movable along the guide rail: and
   a coating brush disposed over the stage for brushing the catalyst so that the catalyst has a uniform thickness on an entire surface of the at least one of the plurality of synthetic substrates and slidably travels by means of the movable body, wherein a height of the coating brush is adjustable.

12. The system of claim 1, wherein the processing chamber includes a retrieve part configured for receiving at least one of the plurality of synthetic substrates unloaded from the reaction chamber and retrieving a carbon nanotube synthesized on at least one of the plurality of synthetic substrates.

13. The system of claim 12, wherein the retrieve part comprises:
   a retrieve container in which a carbon nanotube retrieved from the at least one of the plurality of synthetic substrates is stored; and
   a retrieve unit for brushing the carbon nanotube from the top surface of the at least one of the plurality of synthetic substrates to the retrieve container.

14. The system of claim 13, wherein the retrieve unit comprises: a retrieve brush for brushing the carbon nanotube on the top surface of the at least one of the plurality of synthetic substrates while slidably traveling from One end to the other end of the top surface of the at least one of the plurality of synthetic substrates.

15. The system of claim 1, further comprising:
   a first gate valve configured for connecting the processing chamber with the reaction chamber; and
   a heat shielding member disposed between the first gate valve and the reaction chamber to prevent heat inside the reaction chamber from being transferred to the first gate valve.

16. The system of claim 1, wherein the reaction chamber comprises:
   a reaction tube configured for offering a space in which the plurality of synthetic substrates are accommodated, the reaction tube having front and rear ends each being connected with a flange;
   a scaling member provided between the flange and the reaction tube;
   a heating unit for heating the reaction tube to a predetermined temperature; and
   a cooling member for cooling the sealing member, wherein the heating unit comprises:
   a central heater for heating a central region of the reaction tube;
   an edge heater for heating an edge region adjacent to the front and rear ends of the reaction tube; and
   a heater controller for independently controlling the central heater and the edge heater.

17. The system of claim 16, wherein the edge heater comprises:
   a first heater for heating the edge region of the reaction tube adjacent to the flange connected with the front end of the reaction tube; and
   a second heater for heating the edge region of the reaction tube adjacent to the flange connected with the rear end of the reaction tube, wherein the heater controller independently controls the first heater and the second heater.

18. The system of claim 1, wherein the first transporter comprises:
   a blade configured for supporting at least one of the plurality of synthetic substrates; and
   an arm fixedly coupled with the blade and linearly movable by means of a driver, wherein the blade comprises:
   a plate; and
   a plurality of protrusions protruding upwardly from the plate to contact the synthetic substrate.

19. The system of claim 18, wherein the first transporter comprises:
   a cooling member for cooling the arm to prevent a thermal deformation of the arm when the arm goes into the reaction chamber.

20. The system of claim 1, wherein the reaction chamber comprises:
   a reaction tube configured for offering a space in which the plurality of synthetic substrates are accommodated, the reaction tube having front and rear ends each being connected with a flange;
   a heating unit for healing the reaction tube to a predetermined temperature; and
   a support frame provided into the reaction tube for supporting the plurality of synthetic substrates, the support frame including a plurality of frames provided to protrude inwardly toward the reaction tube from an inner wall of the reaction tube and spaced apart from each other in an up-and-down direction Mr supporting the plurality of synthetic substrates.

21. The system of claim 1, wherein the reaction chamber comprises:
   a reaction tube where a carbon nanotube is produced;
   a heating unit for heating the reaction tube;
   a gas supply pipe configured for supplying a source gas into the reaction tube; and
   a heater member for heating a source gas before the source gas is supplied into the reaction tube.

22. The system of claim 1, wherein the substrate accommodating part farther comprises: a movable frame, a horizontal rail installed on the movable frame, the horizontal rail guiding the cassette to move along a direction perpendicular to a lengthwise direction of the reaction chamber, and a vertical rail guiding the movable frame to move up and down.

23. The system of claim 1 further comprising a second transporter for transporting the plurality of synthetic substrates from the post-treating process to the pre-treating process.

24. The system of claim 1, wherein the first transporter continuously transports the first plurality of synthetic substrates from the reaction Chamber to the processing chamber and from the processing chamber to the reaction chamber.

25. A system for producing carbon nanotubes, comprising:
   a reaction chamber in which a process is performed for producing a carbon nanotube on a synthetic substrate;
   a station part connected to one side of the reaction chamber and has an internal space that is isolated from the outside to prevent the synthetic substrate unloaded from the reaction chamber from contacting oxygen;
   a first transporter disposed within the station part adapted to load the synthetic substrate into the reaction chamber and unload the synthetic substrate from the reaction chamber;
   a substrate accommodating part disposed within the station part for accommodating the synthetic substrate to be loaded into the reaction chamber and the synthetic substrate unloaded from the reaction chamber;
   a retrieve part for drawing out the synthetic substrate from the substrate accommodating part to retrieve a carbon nanotube produced on the synthetic substrate;
   a catalyst coating unit configured for coating a top surface of the synthetic substrate with a catalyst before the synthetic substrate is accommodated in the substrate accommodating part of the station part; and
   a second transporter for transporting the synthetic substrate between the retrieve part and the substrate accommodating part and between the catalyst coating unit and the substrate accommodating part;

wherein the station part includes:
- a first region, disposed to be adjacent to the reaction chamber, where the substrate accommodating part is disposed; and
- a second region, disposed to be collinear with the reaction chamber at an opposite position to the reaction chamber on the basis of the first region, where the first transporter is disposed, wherein the first region includes:
- an upper region disposed to be collinear with the reaction chamber and the substrate accommodating part; and
- a lower region extending from the upper region in a perpendicular direction to the collinear direction, wherein the substrate accommodating part comprises: a cassette provided for accommodating synthetic substrates and movable between the upper region and the lower region.

26. The system of claim 25, wherein the catalyst coating unit, the second transporter, and the retrieve part are disposed outside the station part, wherein the second transporter is disposed to be opposite to the lower region on the basis of the upper region of the first region and disposed between the catalyst coating unit and the retrieve part.

* * * * *